United States Patent
Xu et al.

(10) Patent No.: US 10,622,301 B2
(45) Date of Patent: Apr. 14, 2020

(54) METHOD OF FORMING A STRAIGHT VIA PROFILE WITH PRECISE CRITICAL DIMENSION CONTROL

(71) Applicant: International Business Machines Corporation, Armonk, NY (US)

(72) Inventors: Yongan Xu, Niskayuna, NY (US);
Junli Wang, Slingerlands, NY (US);
Yann Mignot, Slingerlands, NY (US);
Joe Lee, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/104,403

(22) Filed: Aug. 17, 2018

(65) Prior Publication Data

US 2020/0058585 A1    Feb. 20, 2020

(51) Int. Cl.
*H01L 23/48*  (2006.01)
*H01L 23/522* (2006.01)
*H01L 21/768* (2006.01)
*H01L 21/3105* (2006.01)
*H01L 21/02* (2006.01)
(Continued)

(52) U.S. Cl.
CPC ...... *H01L 23/5226* (2013.01); *H01L 21/0228* (2013.01); *H01L 21/02118* (2013.01);
(Continued)

(58) Field of Classification Search
CPC ......... H01L 21/02118; H01L 21/02186; H01L 21/0228; H01L 21/0332; H01L 21/31051;
(Continued)

(56) References Cited

U.S. PATENT DOCUMENTS 5,654,238 A   8/1997  Cronin et al.
7,125,796 B2  10/2006 Weston et al.
(Continued)

FOREIGN PATENT DOCUMENTS

KR   20060018652 A   3/2006
KR   20090091523 A   8/2009

OTHER PUBLICATIONS

Saptadeep Pal, "Supervia: Relieving Routing Congestion Using Double-Height Vias," UCLA: Nanosystems Computer-Aided Design Laboratory, https://escholarship.org/uc/item/4m7366mk, 2017, 9 pages.
(Continued)

*Primary Examiner* — Brook Kebede
(74) *Attorney, Agent, or Firm* — Vazken Alexanian; Ryan, Mason & Lewis, LLP

(57) ABSTRACT

A method for manufacturing a semiconductor device includes forming a first interconnect level having a conductive metal layer formed in a first dielectric layer. In the method, a cap layer is formed on the first interconnect level, and a second interconnect level including a second dielectric layer is formed on the cap layer. The method also includes forming a third interconnect level including a third dielectric layer on the second interconnect level. An opening is formed through the second and third interconnect levels and over the conductive metal layer. Sides of the opening are lined with a spacer material, and a portion of the cap layer at a bottom of the opening is removed from a top surface of the conductive metal layer. The spacer material is removed from the opening, and a conductive material layer is deposited in the opening on the conductive metal layer.

15 Claims, 15 Drawing Sheets

(51) Int. Cl.
*H01L 21/033* (2006.01)
*H01L 21/311* (2006.01)

(52) U.S. Cl.
CPC .... *H01L 21/02186* (2013.01); *H01L 21/0332* (2013.01); *H01L 21/31051* (2013.01); *H01L 21/31116* (2013.01); *H01L 21/31144* (2013.01); *H01L 21/76816* (2013.01); *H01L 21/76831* (2013.01); *H01L 21/76834* (2013.01); *H01L 21/76877* (2013.01)

(58) Field of Classification Search
CPC ......... H01L 21/31116; H01L 21/31144; H01L 21/76804; H01L 21/76816; H01L 21/76831; H01L 21/76834; H01L 21/76877; H01L 21/76879; H01L 23/5226; H01L 23/53228; H01L 23/53238; H01L 23/53295
USPC .................................. 438/619–630; 257/774
See application file for complete search history.

(56) References Cited

U.S. PATENT DOCUMENTS

| | | | |
|---|---|---|---|
| 9,385,078 B1 | 7/2016 | Feurprier et al. | |
| 9,425,086 B2 | 8/2016 | Hsu et al. | |
| 9,466,523 B2 | 10/2016 | Kakegawa et al. | |
| 9,805,972 B1 | 10/2017 | Zhang et al. | |
| 10,020,254 B1* | 7/2018 | Bao | H01L 23/53295 |
| 10,020,255 B1 | 7/2018 | Bao et al. | |
| 2005/0127495 A1* | 6/2005 | Zhang | H01L 23/3178 257/700 |
| 2008/0057692 A1 | 3/2008 | Wells et al. | |
| 2008/0073748 A1 | 3/2008 | Bielefeld et al. | |
| 2011/0207323 A1 | 8/2011 | Ditizio | |
| 2014/0284813 A1 | 9/2014 | Greco et al. | |
| 2015/0311162 A1 | 10/2015 | Chen | |
| 2017/0271202 A1 | 9/2017 | Xu et al. | |
| 2018/0033685 A1 | 2/2018 | Chen et al. | |
| 2018/0061700 A1 | 3/2018 | Sun et al. | |
| 2018/0102378 A1 | 4/2018 | Lee | |

OTHER PUBLICATIONS

Scotten Jones, "SEMICON West—Advanced Interconnect Challenges," https://www.semiwiki.com/forum/content/6932-semicon-west-advanced-interconnect-challenges.html, Jul. 28, 2017, 4 pages.
List of IBM Patents or Patent Applications Treated as Related.

* cited by examiner

METHOD OF FORMING A STRAIGHT VIA PROFILE WITH PRECISE CRITICAL DIMENSION CONTROL

TECHNICAL FIELD

The field generally relates to semiconductor devices and methods of manufacturing same and, in particular, to forming a straight via profile with precise critical dimension (CD) control to avoid shorting to interconnect structures.

BACKGROUND

In general, vias are vertical pathways to electrically connect a first metal layer to a second metal layer in a semiconductor device. A super via is vertical pathway which spans more than one metal layer, such as, for example, a via which spans two metal layers, and does not include a landing pad on an intermediate metal layer. Conventional methods for manufacturing super vias result in necking portions, where middle portions of the super vias have a reduced width compared with that of overlaying and underlying portions of the super via. For example, a necking profile can occur during formation of a super via at a location corresponding to a transition between dielectric materials of two different interconnect levels. The necking profile can be due to a capping layer between two dielectric layers of different interconnect levels having a slower etch rate than the dielectric layers during a reactive ion etch (ME) process to form the super via. The slower etch rate of the capping layer causes the reduced width of that portion.

In addition, conventional methods for forming vias or super vias do not maintain sufficient control over via or super via critical dimensions (CDs), especially when etching dielectric layers (e.g., ultra-low K (ULK) dielectric layers). Since increased chip density leads to via and interconnect distance being relatively close, shorts can occur between vias and interconnects when via or super via CDs are too large due to over-etching of dielectric layers. For example, top portions of vias and super vias in 10 nm node typically have larger CDs than the bottom portions, resulting in top CDs, which are out of specification.

Accordingly, there is a need for methods and structures which prevent overly large CDs in vias and super vias, and necking profiles in super vias.

SUMMARY

According to an exemplary embodiment of the present invention, a method for manufacturing a semiconductor device includes forming a first interconnect level including a first dielectric layer and a first conductive layer formed in the first dielectric layer. In the method, a first cap layer is formed on the first interconnect level, and a second interconnect level is formed on the first cap layer. The second interconnect level includes a second dielectric layer and a second conductive layer formed in the second dielectric layer. The method further includes forming a third interconnect level on the second interconnect level, wherein the third interconnect level includes a third dielectric layer. Portions of the second and third dielectric layers over the first conductive layer are removed during an etching process to create a super via opening through the second and third interconnect levels and over the first conductive layer. Sides of the super via opening are lined with a spacer material, and portions of the first cap layer at a bottom of the super via opening are removed from a top surface of the first conductive layer. The spacer material is removed from the super via opening, and a conductive material layer is deposited in the super via opening on the first conductive layer.

According to an exemplary embodiment of the present invention, a semiconductor device includes a first interconnect level having a first dielectric layer and a first conductive layer formed in the first dielectric layer. A first cap layer is disposed on the first interconnect level, and a second interconnect level is disposed on the first cap layer. The second interconnect level includes a second dielectric layer and a second conductive layer formed in the second dielectric layer. The device further includes a third interconnect level disposed on the second interconnect level, wherein the third interconnect level includes a third dielectric layer. A super via including a conductive material layer is disposed through the second and third interconnect levels and on the first conductive layer. The super via comprises a straight profile through the second and third interconnect levels.

According to an exemplary embodiment of the present invention, a method for manufacturing a semiconductor device includes forming a first interconnect level having a first dielectric layer and a conductive metal layer formed in the first dielectric layer. In the method, a cap layer is formed on the first interconnect level, and a second interconnect level is formed on the cap layer. The second interconnect level includes a second dielectric layer. The method also includes forming a third interconnect level on the second interconnect level, wherein the third interconnect level includes a third dielectric layer. An opening is formed through the second and third interconnect levels and over the conductive metal layer. Sides of the opening are lined with a spacer material, and a portion of the cap layer at a bottom of the opening is removed from a top surface of the conductive metal layer. The spacer material is removed from the opening, and a conductive material layer is deposited in the opening on the conductive metal layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
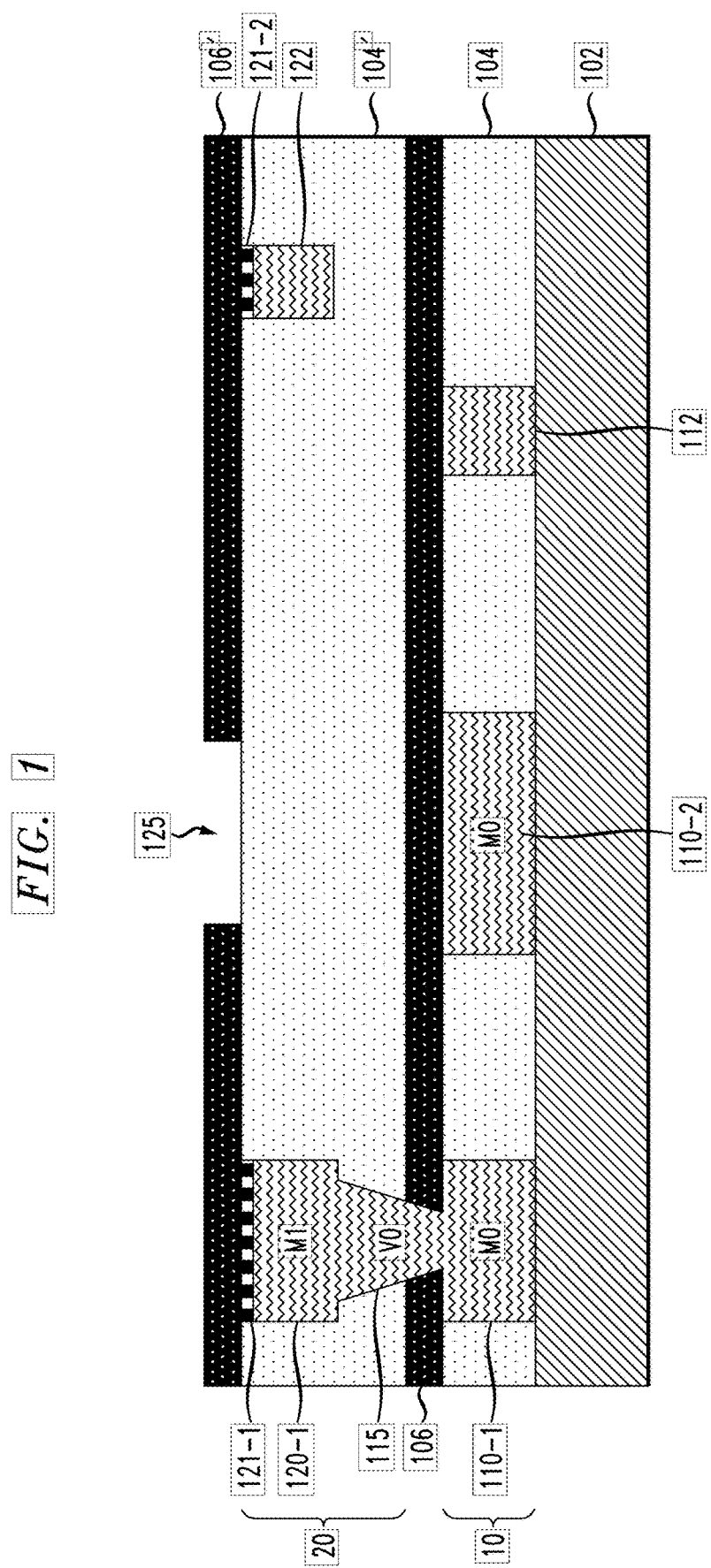
FIG. 1 is a cross-sectional view illustrating fabrication of a semiconductor device at a back-end-of-line (BEOL) or middle-of-line (MOL), and showing formation of a hardmask window for a super via, according to an exemplary embodiment of the present invention.

Exemplary embodiments of the invention will now be discussed in further detail with regard to semiconductor devices and methods of manufacturing same and, in particular, to controlling CDs for straight via profiles to avoid shorts with interconnect structures.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with one or more embodiments of the present invention, in order to avoid via and interconnect shorts, and maintain good CD control and desired profiles in vias and super vias, a spacer material is introduced in both regular vias and super vias after via etching. The embodiments of the present invention further include performing a trench etch, and removal of the spacer material by a wet etch process.

The embodiments of the present invention result in straight via and super via profiles, which are not tapered, and are not subject to necking. More specifically, embodiments of the present invention utilize a window structure in a hardmask to avoid a necking profile post RIE, and spacers are used so that via and/or super via CDs are well controlled during trench etching, dielectric layer (e.g., ULK layer) damage is minimized or prevented, and super via profiles are optimized.

As used herein, a "straight profile", "straight via profile" or "straight super via profile" refers to a via or super via structure which is not tapered or substantially not tapered from a top surface to a bottom surface thereof, such that a CD (e.g., lateral width) of the via or super via is constant or substantially constant from a top surface to a bottom surface of the via or super via. For example, a "straight profile", "straight via profile" or "straight super via profile" is defined base on the angle at the bottom of the landing via or super via for a value >87° in the non-self-aligned via (non-SAV) direction and >89° in the self-aligned via (SAV) direction.

FIG. 1 is a cross-sectional view illustrating fabrication of a semiconductor device at a back-end-of-line (BEOL) or middle-of-line (MOL), and showing formation of a hardmask window for a super via, according to an exemplary embodiment of the present invention. Referring to FIG. 1, a first interconnect level 10 includes metal conductive layers 110-1 and 110-2 formed in a layer of dielectric material 104 by, for example, lithography in a damascene process, and disposed on a substrate 102. The substrate 102 includes one or more devices, such as, for example, transistors, capacitors, and resistors, that make up the integrated circuit formed during the front end of line (FEOL) processing.

A second interconnect level 20 similarly includes metal conductive layer 120-1 formed in a dielectric layer 104' also by, for example, lithography in a damascene process. While one and two metal conductive layers 110-1, 110-2 and 120-1 are shown in the first and second interconnect levels 10 and 20, the embodiments of the present invention are not necessarily limited thereto, and may include more or less metal conductive layers. It is to be understood that the first and second interconnect levels 10 and 20 are part of a BEOL or MOL interconnect structure of an integrated circuit where devices, including, but not limited to, transistors, capacitors, and resistors are interconnected with the metal conductive layers 110-1, 110-2 and 120-1 (e.g., wiring) on a wafer.

The metal conductive layers 110-1, 110-2 and 120-1 include, for example, copper (Cu), aluminum (Al), nickel (Ni), cobalt (Co), iron (Fe), gold (Au), silver (Ag), ruthenium (Ru), palladium (Pd), platinum (Pt), iridium (Ir), tungsten (W), and any mixtures or alloys thereof. The metal conductive layers 110-1 and 110-2 in the first interconnect level 10, and the metal conductive layer 120-1 in the second interconnect level 20 are respectively referred to as metal-0 (M0) and metal-1 (M1). The first and second interconnect levels 10 and 20 further include overlay alignment markers 112 and 122 formed of metal conductive layer materials the same or similar to that of the metal conductive layers 110-1, 110-2 and 120-1. The overlay alignment markers 112 and 122 are used during processing (e.g., lithography) as references when positioning subsequent patterns to the overlay alignment markers 112 and 122. Multiple overlay alignment markers may be used in each interconnect level. Each interconnect level includes a dielectric cap layer 106 and 106', such as, but not necessarily limited to, SiCN, SiCHN, or other nitride, positioned thereon. The dielectric cap layers 106 and 106' have planar top surfaces. The material of the dielectric cap layer 106 or 106' inhibits diffusion of copper. The thickness of the dielectric cap layers 106 and 106' can be about 5 nm to about 30 nm each.

The materials of the dielectric layers 104 and 104' can be the same as each other, and can include, for example, a low-k dielectric material having a dielectric constant (k value) less than 3.9, which is the dielectric constant of silicon dioxide ($SiO_2$). The dielectric material includes, but is not necessarily limited to, $SiO_2$, silsesquixoanes, carbon-doped silicon oxide (SiCOH), SiLK® dielectrics, or multi-layers thereof. The dielectric material includes porous or non-porous forms of these low-k dielectric films. The thickness of the dielectric layers 104 and 104' varies depending upon design constraints, and, generally, can be in the range of about 10 nm to about 1000 nm.

The metal conductive layers 120-1 and 110-1 are electrically coupled to each other by a via (V0) 115, which extends vertically from the second interconnect level 20 through the cap layer 106 to the metal conductive layer 110-1. The via (V0) 115 includes a metal conductive layer material the same or similar to that of the metal conductive layer 120-1. Cobalt caps 121-1 and 121-2 can be provided on the upper most surfaces of the metal conductive layers (e.g. metal conductive layer 120-1) and of the overlay markers (e.g., overlay marker 122). The cobalt caps 121-1 and 121-2 are used only in the case of a copper metallization and are, therefore, optional.

As shown in FIG. 1, a portion of the dielectric cap layer 106' is removed from an area over the metal conductive layer 110-2 in the first interconnect level 10 to create an opening 125 in the dielectric cap layer 106' exposing the underlying dielectric layer 104'. The opening 125 is referred to herein as a hardmask window 125 or window 125. The location of the hardmask window 125 corresponds to where a super via is to be formed. By removing the portion of the dielectric cap layer 106' to form the window 125, when etching is subsequently performed to form the super via through a dielectric layer 104" of a third interconnect level 30 described further herein (see FIG. 2), and the dielectric layer 104' of the second interconnect level 20, the etching needs to only remove the same material of the dielectric layers 104' and 104" since the dielectric cap layer 106' has already been removed. As a result, necking caused by different etch rates between the dielectric cap layer 106' and the dielectric layers 104" and 104' is avoided because the dielectric cap layer 106' has already been removed, and a super via having a straight profile can be formed.

The hardmask window 125 is formed by photolithography with a block or cut mask to selectively remove portions of the dielectric cap layer 106' and form the window 125. The window 125 is formed using an etch process, such as, for example, a dry etch (e.g., RIE, plasma etching, ion beam etching, or laser ablation).

Figure 2:
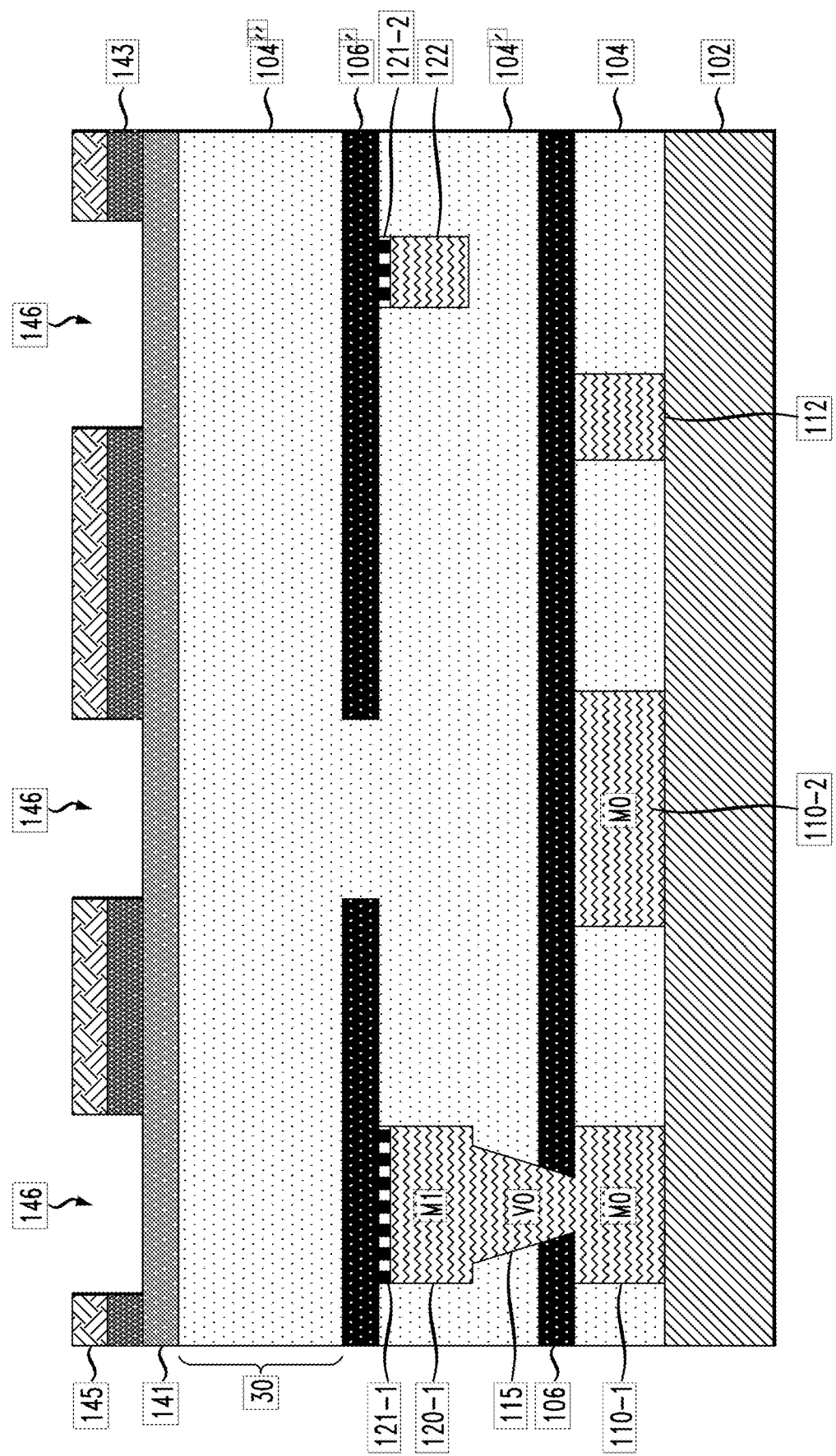
FIG. 2 is a cross-sectional view illustrating fabrication of a semiconductor device at a BEOL or MOL, and showing formation of a third interconnect level and hardmask patterning, according to an exemplary embodiment of the present invention.

FIG. 2 is a cross-sectional view illustrating fabrication of a semiconductor device at a BEOL or MOL, and showing formation of a third interconnect level and hardmask patterning, according to an exemplary embodiment of the present invention. Referring to FIG. 2, a third interconnect level 30 is formed by depositing a dielectric layer 104" onto the structure from FIG. 1 using one or more deposition techniques, including but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. The top surface of the dielectric layer 104" is planarized using, for example, chemical mechanical planarization (CMP). According to one or more embodiments, the material of the dielectric layer 104" is the same as the dielectric material used in dielectric layers 104 and 104'. The thickness of the dielectric layer 104" varies depending upon design constraints, and, generally, can be in the range of about 10 nm to about 1000 nm.

A sacrificial dielectric layer 141 and a hardmask structure comprising a first layer 143 and a second layer 145 are deposited in a stacked structure on dielectric layer 104" using one or more deposition techniques, including but not necessarily limited to, CVD, PECVD, RFCVD, PVD, ALD, MLD, MBD, PLD, LSMCD, and/or sputtering. According to one or more embodiments of the present invention, the sacrificial layer 141 includes, for example, a multi-layer dielectric including an ultra-low k (ULK) dielectric, SiN and/or other dielectric, the first layer 143, which is deposited on the sacrificial layer 141, includes titanium nitride (TiN), and the second layer 145, which is deposited on the first layer 143, includes tetraethyl orthosilicate (TEOS). The combined thickness of the sacrificial, first and second layers 141, 143 and 145 is in the range of about 20 nm to about 100 nm. Other materials for layer 143 can be, for example, TaN or Sn, as long as there is sufficient etch selectivity between layer 143 and layers 141 and 145.

As shown in FIG. 2, the first and second layers 143 and 145 are lithographically patterned to form openings 146 stopping at the sacrificial layer 141, which correspond to the underlying conductive layer 120-1 and alignment marker 122 in the second interconnect level 20, and the underlying conductive layers 110-1 and 110-2 in the first interconnect layer 10. Regular height (e.g., non-super) via structures will be formed to conductive layer 120-1 and alignment marker 122, and a super via structure will be formed to conductive layer 110-2. A multilayer patterning scheme can be used to form the openings 146.

Figure 3:
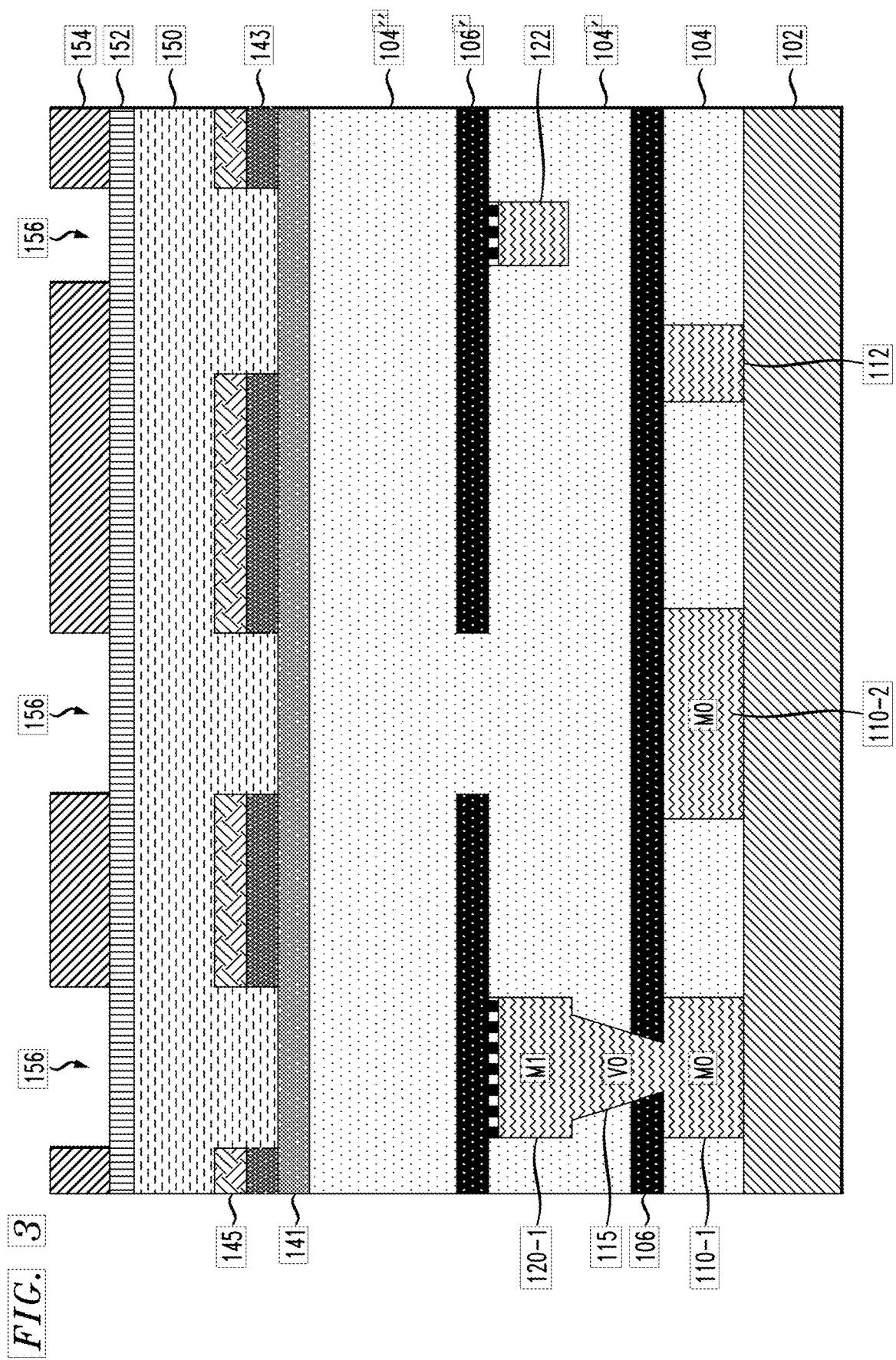
FIG. 3 is a cross-sectional view illustrating fabrication of a semiconductor device at a BEOL or MOL, and showing formation of an organic planarization layer (OPL), underlayer and a photoresist pattern, according to an exemplary embodiment of the present invention.

FIG. 3 is a cross-sectional view illustrating fabrication of a semiconductor device at a BEOL or MOL, and showing formation of an organic planarization layer (OPL), underlayer and a photoresist pattern, according to an exemplary embodiment of the present invention. Referring to FIG. 3, an organic planarization layer (OPL) 150, an underlayer 152, and a patterned photoresist layer 154 are formed on the structure from FIG. 2. The OPL 150 includes, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 150 can be deposited, for example, by spin coating, followed by a planarization process, such as, for example, CMP.

The underlayer 152 includes, but is not necessarily limited to, silicon anti reflective coating (SiARC) or other hardmask material. The patterned photoresist layer 154 has openings 156 corresponding at least in part to openings 146.

Figure 4:
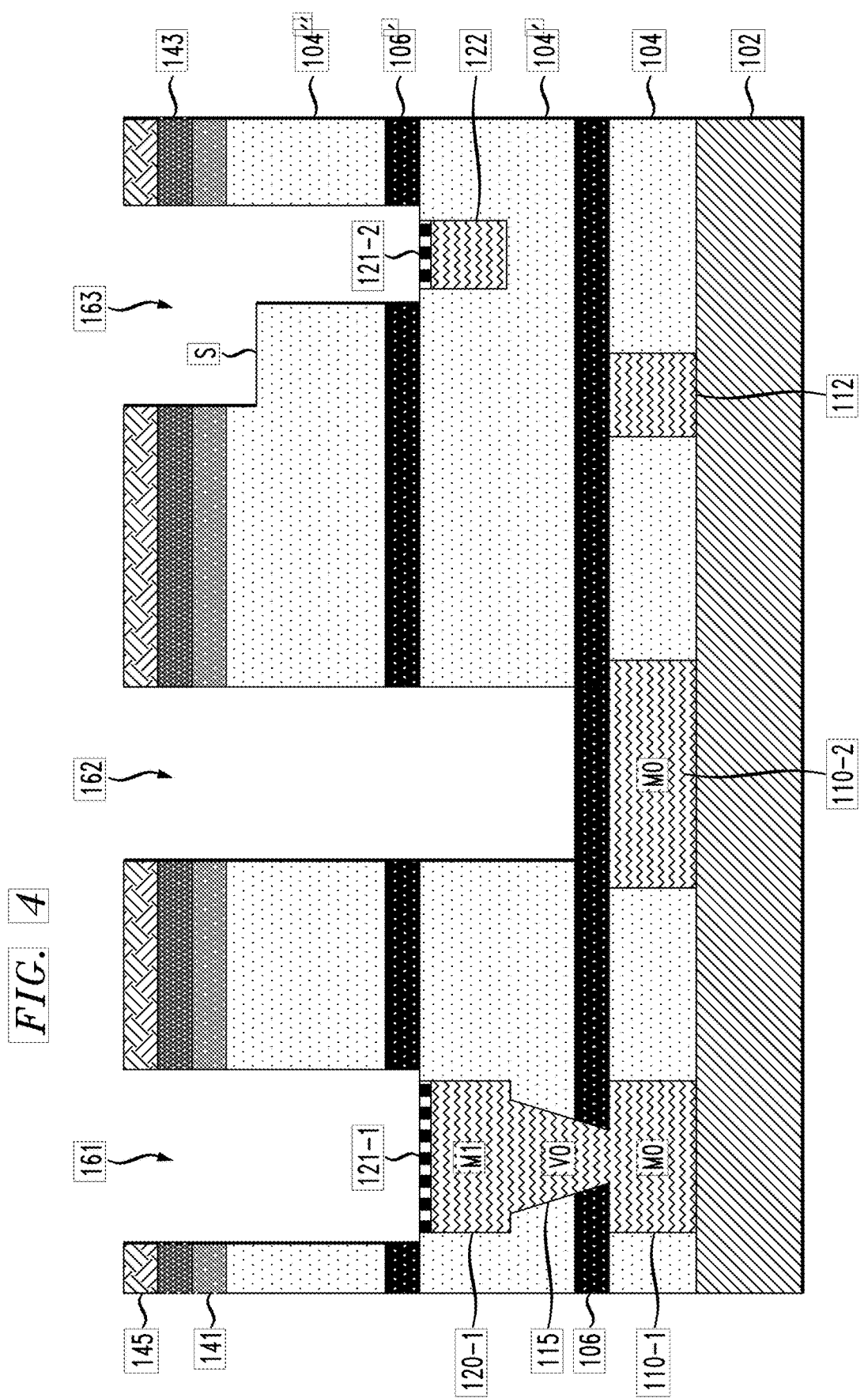
FIG. 4 is a cross-sectional view illustrating fabrication of a semiconductor device at a BEOL or MOL, and showing removal of an OPL and portions of second and third interconnect levels to form openings for vias and a super via, according to an exemplary embodiment of the present invention.

FIG. 4 is a cross-sectional view illustrating fabrication of a semiconductor device at a BEOL or MOL, and showing removal of an OPL and portions of second and third interconnect levels to form openings for vias and a super via, according to an exemplary embodiment of the present invention. Referring to FIG. 4, following the processing described in connection with FIG. 3, one or more etch processes are utilized to transfer the pattern from the patterned photoresist 154 into the dielectric layer 104" in the case of a regular via or into the dielectric layers 104" and 104' in the case of a super via. The etching process can be a dry etch, such as, for example, ME, plasma etching, ion beam etching, or laser ablation. A ME process can be used to form the various openings 161, 162 and 163 for the via structures corresponding to the underlying metal conductive layers 120-1, 110-2 or alignment marker 122.

As shown in FIG. 4, the opening 162 for the super via structure terminates at the underlying dielectric cap layer 106 on the metal conductive layer 110-2. A subsequent trench etch (see FIG. 7) removes the dielectric cap layer 106 to expose the metal conductive layer 110-2 for electrical contact. The opening 162 for the super via structure spans two interconnect levels 20 and 30 relative to the openings 161 and 163 for the regular sized vias which span a single interconnect level (i.e., the third interconnect level 30). The openings 161 and 163 terminate at the underlying cap layers 121-1 and 121-2 on the metal conductive layer 120-1 and the alignment marker 122.

In connection with the embodiment in FIG. 4, after etching through the OPL 150, the sacrificial layer 141, the dielectric cap layer 106' and the dielectric layers 104" and 104' based on the photoresist pattern 154, the photoresist pattern 154, the underlayer 152 and the OPL 150 are removed. Referring back to FIG. 2 and to FIG. 4, the removal of the photoresist pattern 154, the underlayer 152 and the OPL 150 exposes a remaining portion of the sacrificial layer 141 which corresponds to a stepped portion S in the opening 163. The stepped portion S corresponds to a wider rightmost opening 146 between the layers 143 and 145 (see FIG. 2) than the rightmost opening 156 in the photoresist pattern 154 in FIG. 3. Following removal of the photoresist pattern 154, the underlayer 152 and the OPL 150, the exposed portion of the sacrificial layer 141 and a portion of the dielectric layer 104" under the exposed portion of the sacrificial layer 141 are etched to form the stepped portion S in the opening 163.

Figure 5:
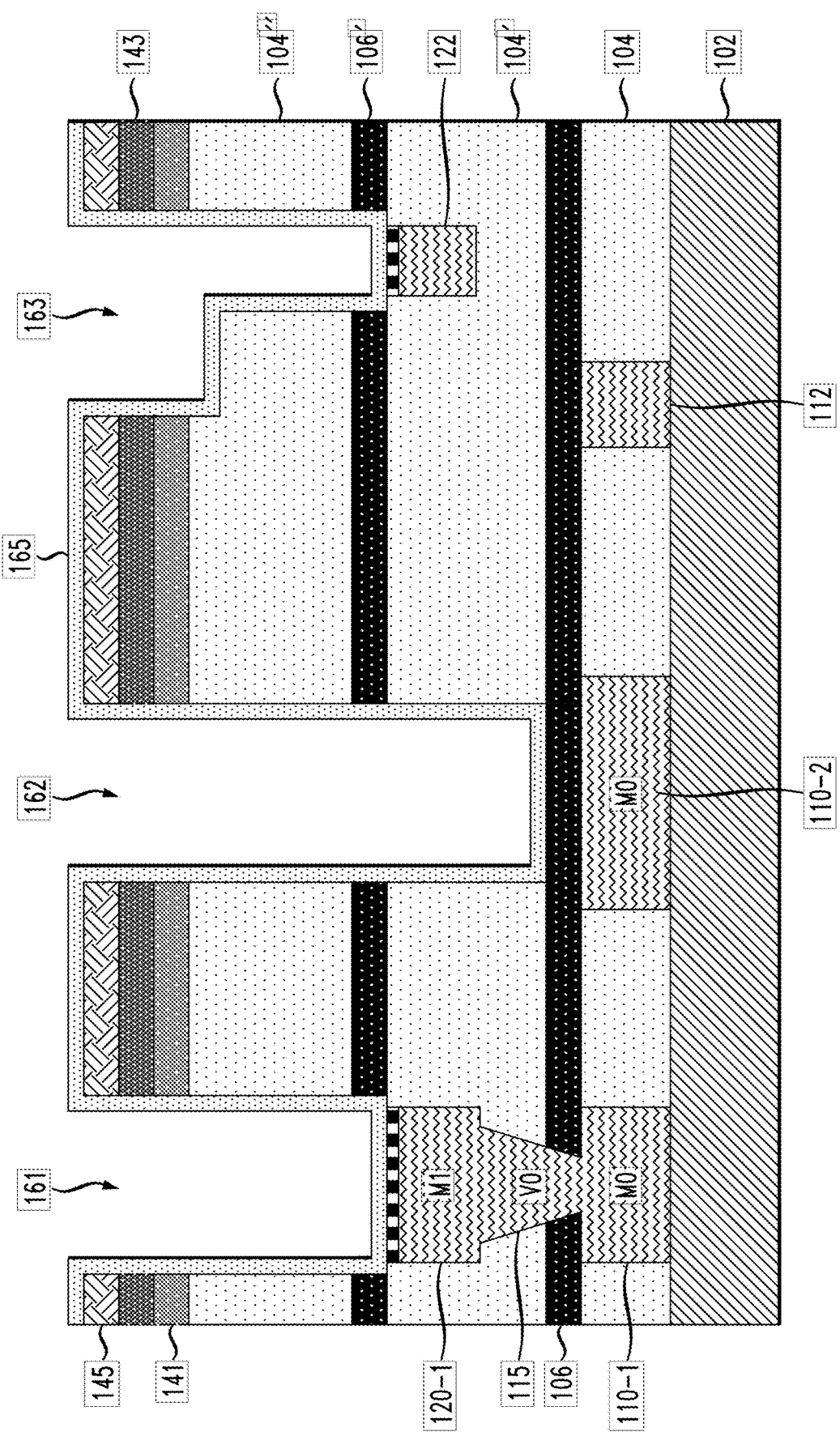
FIG. 5 is a cross-sectional view illustrating fabrication of a semiconductor device at a BEOL or MOL, and showing spacer deposition in vias and a super via, according to an exemplary embodiment of the present invention.

FIG. 5 is a cross-sectional view illustrating fabrication of a semiconductor device at a BEOL or MOL, and showing spacer deposition in vias and a super via, according to an exemplary embodiment of the present invention. Referring to FIG. 5, a spacer layer 165 is conformally deposited on exposed vertical and horizontal surfaces in the openings 161, 162 and 163 and on exposed portions of the layer 145 at a top of the FIG. 4 structure. The spacer layer 165 is conformally deposited using, for example, one or more conformal deposition techniques including, but not necessarily limited to, ALD. In accordance with an embodiment of the present invention, the spacer layer 165 includes for example, TiN, aluminum nitride (AlN) or other nitride, or an oxide, such as, for example, aluminum oxide ($Al_2O_3$). A thickness of the spacer layer 165 is in the range of about 5 angstroms to about 50 angstroms.

Figure 6:
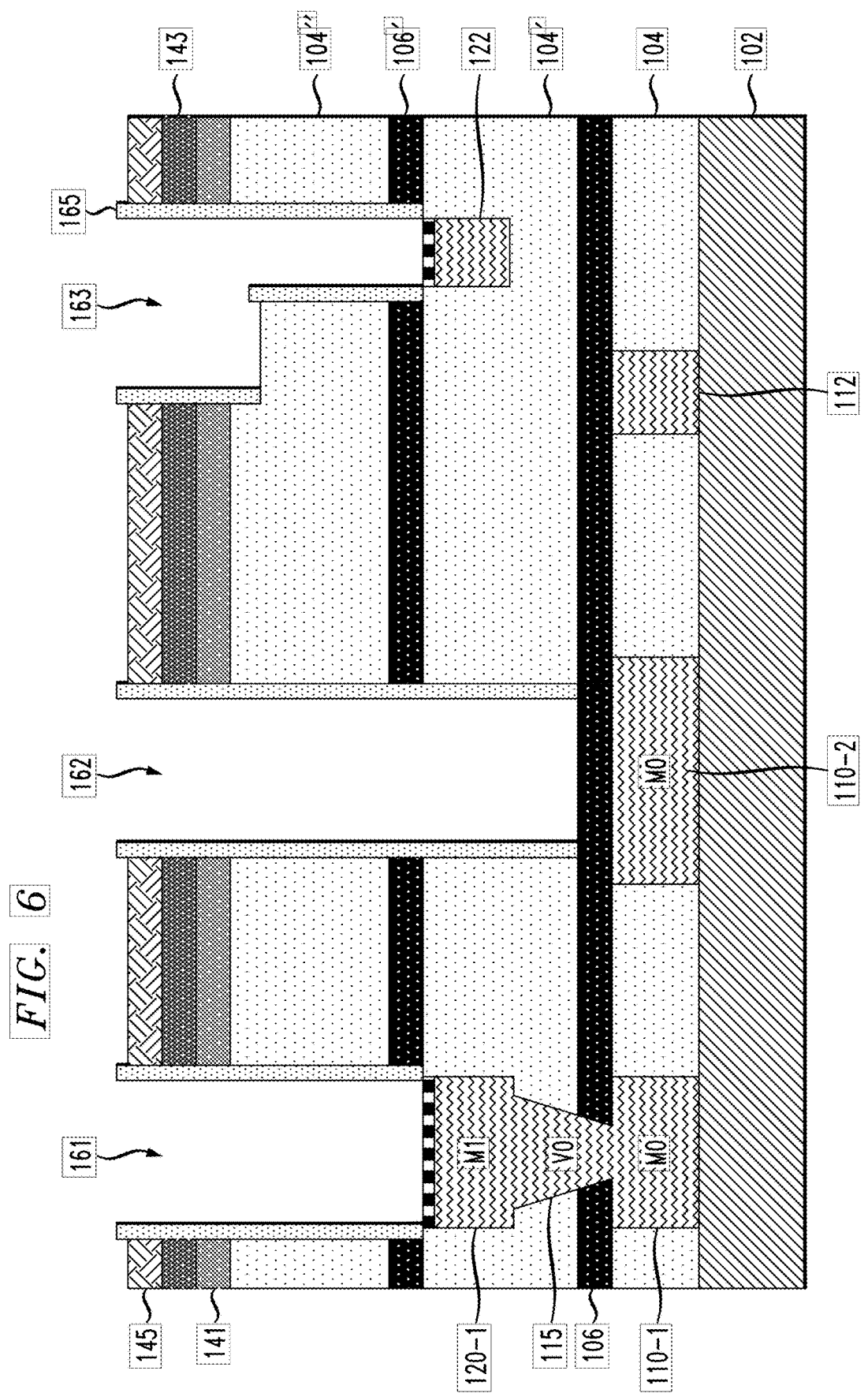
FIG. 6 is a cross-sectional view illustrating fabrication of a semiconductor device at a BEOL or MOL, and showing spacer etchback, according to an exemplary embodiment of the present invention.

FIG. 6 is a cross-sectional view illustrating fabrication of a semiconductor device at a BEOL or MOL, and showing spacer etchback, according to an exemplary embodiment of the present invention. Referring to FIG. 6, horizontal portions of the spacer layer 165 are removed using, for example, an anisotropic etching process, which targets for removal horizontal portions of the spacer layer 165 in the openings 161, 162 and 163 and on the layer 145 at a top of the structure. Vertical portions of the spacer layer 165 remain. The anisotropic etching process includes, for example, a RIE process utilizing an oxide etching chemistry containing, for example, $C_xF_y$, which would include gases such as $CF_4$, $C_4F_8$, $C_4F_6$, $CH_2F_2$, etc., as well as dilution gases such as Ar, $N_2$, $H_2$, etc.

Figure 7:
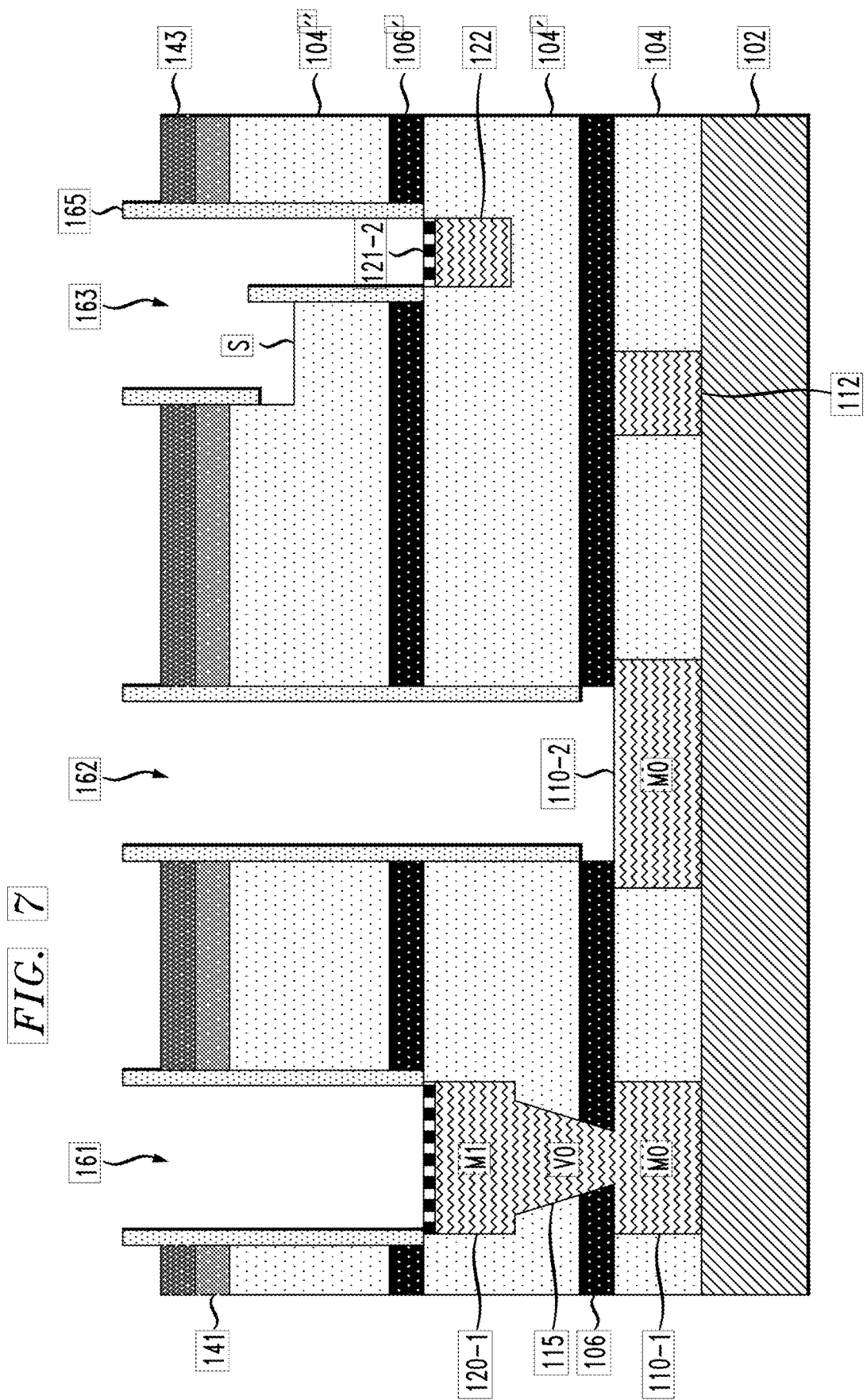
FIG. 7 is a cross-sectional view illustrating fabrication of a semiconductor device at a BEOL or MOL, and showing removal of an upper hardmask layer and trench etching, according to an exemplary embodiment of the present invention.

FIG. 7 is a cross-sectional view illustrating fabrication of a semiconductor device at a BEOL or MOL, and showing removal of an upper hardmask layer and trench etching, according to an exemplary embodiment of the present invention. Referring to FIG. 7, the second layer 145 of the hardmask structure is removed. As noted above, according to one or more embodiments of the present invention, the second layer 145 includes TEOS. The TEOS layer is removed using, for example, an oxide etching chemistry containing, for example, $C_xF_y$, which would include gases such as $CF_4$, $C_4F_8$, $C_4F_6$, $CH_2F_2$, etc., as well as dilution gases such as Ar, $N_2$, $H_2$, etc.

During removal of the second layer 145, a trench etch process is performed to recess the stepped portion S in the opening 163, and to remove the dielectric cap layer 106 in the super via opening 162 in order to expose the conductive layer 110-2 in the first interconnect level 10. The trench etch process is performed using, for example, the oxide etching chemistry used to remove the second layer 145. The remaining spacers 165 in the openings 161, 162 and 163 protect the underlying dielectric layers 104" and 104' in the openings from exposure to the etchant during the trench etching process, so that the CDs (e.g., horizontal widths in FIG. 7) of the openings 161, 162 and 163 are maintained. Accordingly, due to the presence of the spacers, the CDs and straight profiles of the via and super via openings are controlled and maintained during the trench etch process. As a result, with reference to FIG. 15 described herein below, the resulting vias and super via have straight profiles with a constant or substantially constant lateral width from top to bottom of the vias and super via.

Figure 8:
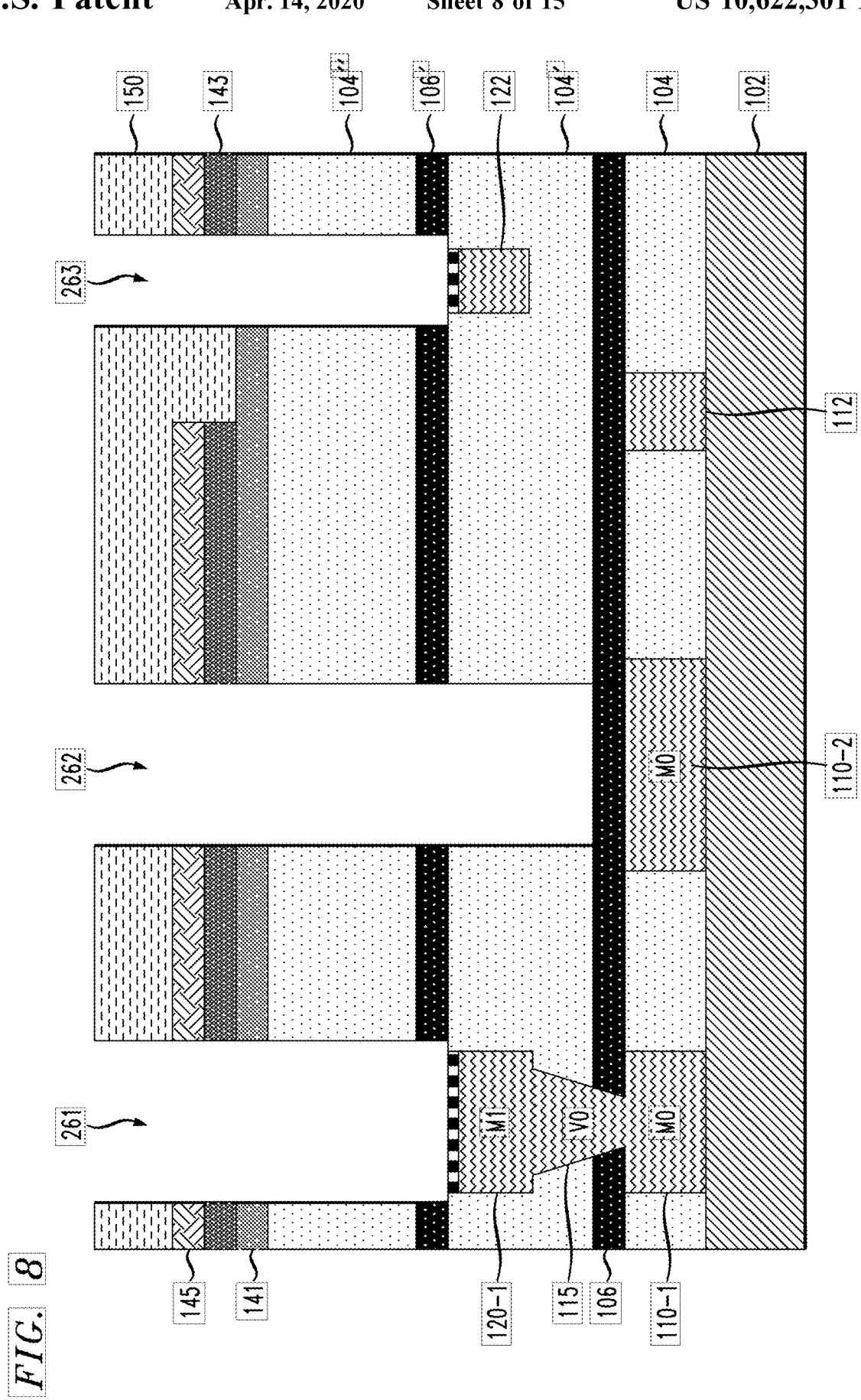
FIG. 8 is a cross-sectional view illustrating fabrication of a semiconductor device at a BEOL or MOL, and showing removal of portions of second and third interconnect levels to form openings for vias and a super via, according to an exemplary embodiment of the present invention.

The processing described in FIGS. 8-12 follows from FIG. 3. FIG. 8 is a cross-sectional view illustrating fabrication of a semiconductor device at a BEOL or MOL, and showing removal of portions of second and third interconnect levels to form openings for vias and a super via, according to an exemplary embodiment of the present invention. Referring to FIG. 8, following the processing described in connection with FIG. 3, one or more etch processes are utilized to transfer the pattern from the patterned photoresist 154 into the dielectric layer 104" in the case of a regular via or into the dielectric layers 104" and 104' in the case of a super via. The etching process can be a dry etch, such as, for example, RIE, plasma etching, ion beam etching, or laser ablation. A RIE process can be used to form the various openings 261, 262 and 263 for the via structures corresponding to the underlying metal conductive layers 120-1, 110-2 or alignment marker 122.

As shown in FIG. 8, the opening 262 for the super via structure terminates at the underlying dielectric cap layer 106 on the metal conductive layer 110-2. A subsequent trench etch (see FIG. 12) removes the dielectric cap layer 106 to expose the metal conductive layer 110-2 for electrical contact. The opening 262 for the super via structure spans two interconnect levels 20 and 30 relative to the openings 261 and 263 for the regular sized vias which span a single interconnect level (i.e., the third interconnect level 30). The openings 261 and 263 terminate at the underlying cap layers 121-1 and 121-2 on the metal conductive layer 120-1 and the alignment marker 122.

In connection with the embodiment in FIG. 8, after etching through the OPL 150, the sacrificial layer 141, the dielectric cap layer 106' and the dielectric layers 104" and 104' based on the photoresist pattern 154, the photoresist pattern 154 and the underlayer 152 are removed, and the remaining portion of the OPL 150 is maintained as shown in FIG. 8.

Figure 9:
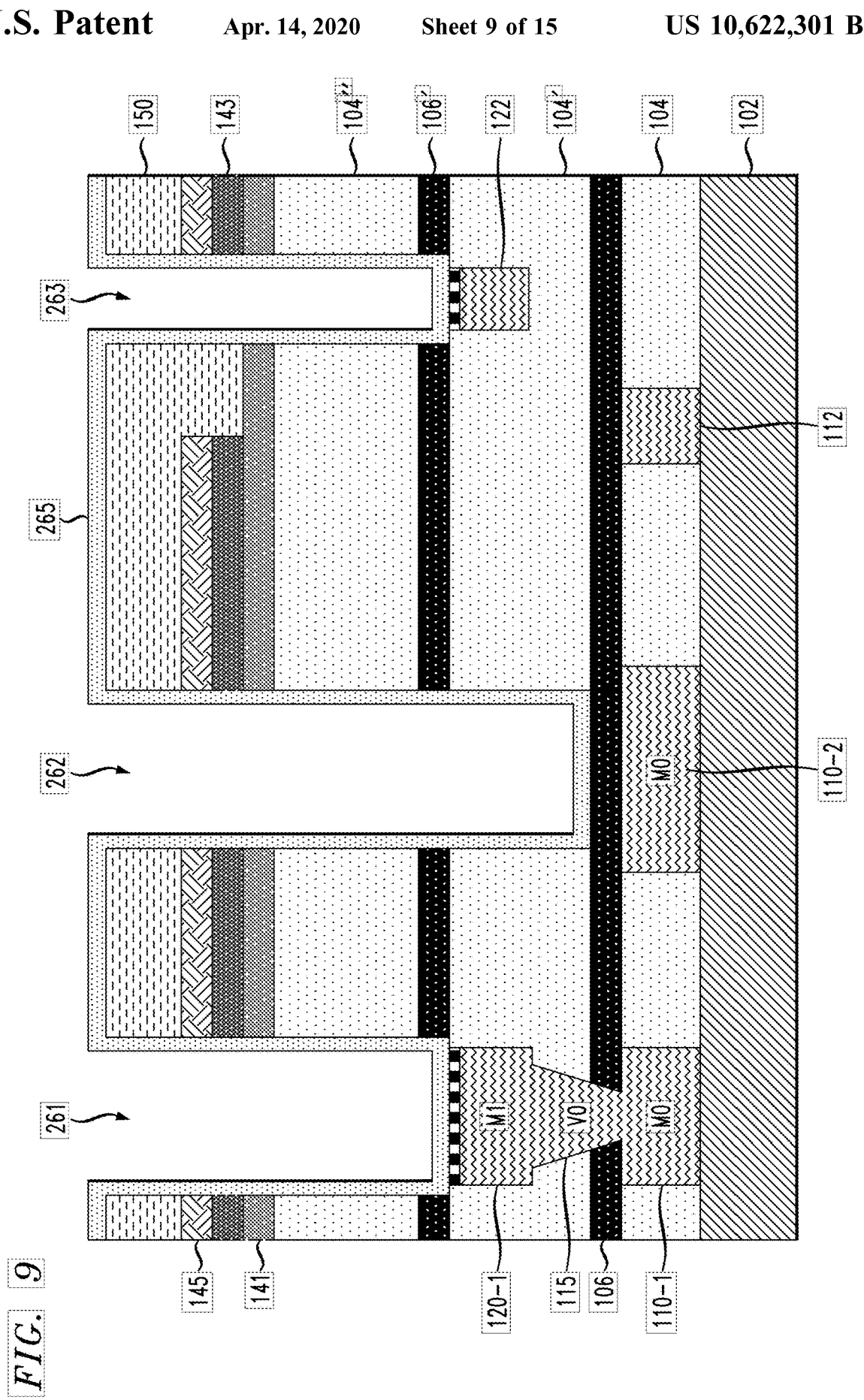
FIG. 9 is a cross-sectional view illustrating fabrication of a semiconductor device at a BEOL or MOL, and showing spacer deposition, according to an exemplary embodiment of the present invention.

FIG. 9 is a cross-sectional view illustrating fabrication of a semiconductor device at a BEOL or MOL, and showing spacer deposition, according to an exemplary embodiment of the present invention. Referring to FIG. 9, a spacer layer 265 is conformally deposited on exposed vertical and horizontal surfaces in the openings 261, 262 and 263 and on exposed portions of the OPL 150 at a top of the FIG. 8 structure. The spacer layer 265 is conformally deposited using, for example, one or more conformal deposition techniques including, but not necessarily limited to, ALD. In accordance with an embodiment of the present invention, the spacer layer 265 includes for example, TiN, AlN or other nitride, or an oxide, such as, for example, $Al_2O_3$. A thickness of the spacer layer 265 is in the range of about 5 angstroms to about 50 angstroms.

Figure 10:
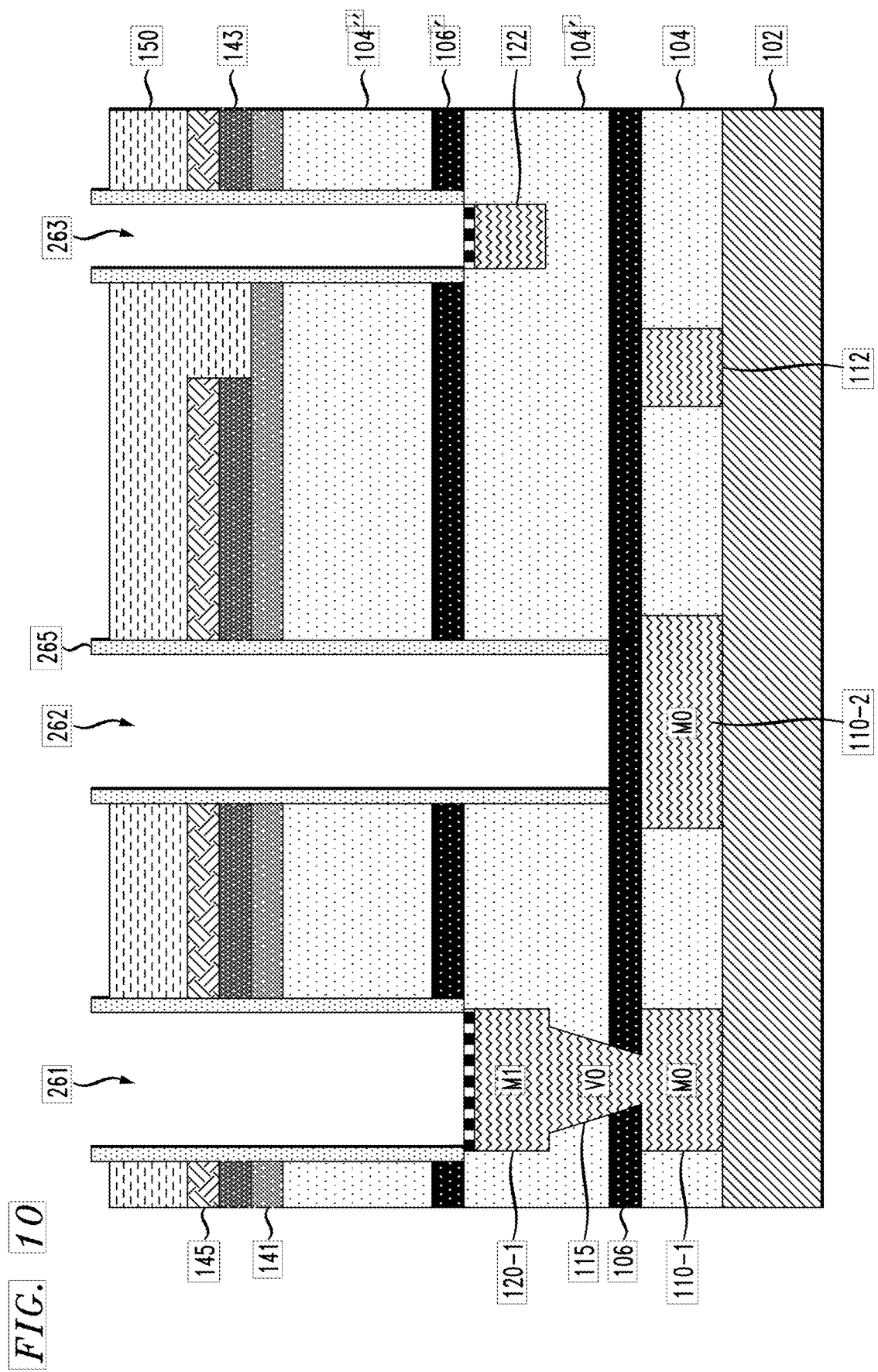
FIG. 10 is a cross-sectional view illustrating fabrication of a semiconductor device at a BEOL or MOL, and showing spacer etchback, according to an exemplary embodiment of the present invention.

FIG. 10 is a cross-sectional view illustrating fabrication of a semiconductor device at a BEOL or MOL, and showing spacer etchback, according to an exemplary embodiment of the present invention. Referring to FIG. 10, horizontal portions of the spacer layer 265 are removed using, for example, an anisotropic etching process, which targets for removal horizontal portions of the spacer layer 265 in the openings 261, 262 and 263 and on the OPL 150 at a top of the structure. Vertical portions of the spacer layer 265 remain. The anisotropic etching process includes, for example, a RIE process utilizing an oxide etching chemistry containing, for example, $C_xF_y$, which would include gases such as $CF_4$, $C_4F_8$, $C_4F_6$, $CH_2F_2$, etc., as well as dilution gases such as Ar, $N_2$, $H_2$, etc.

Figure 11:
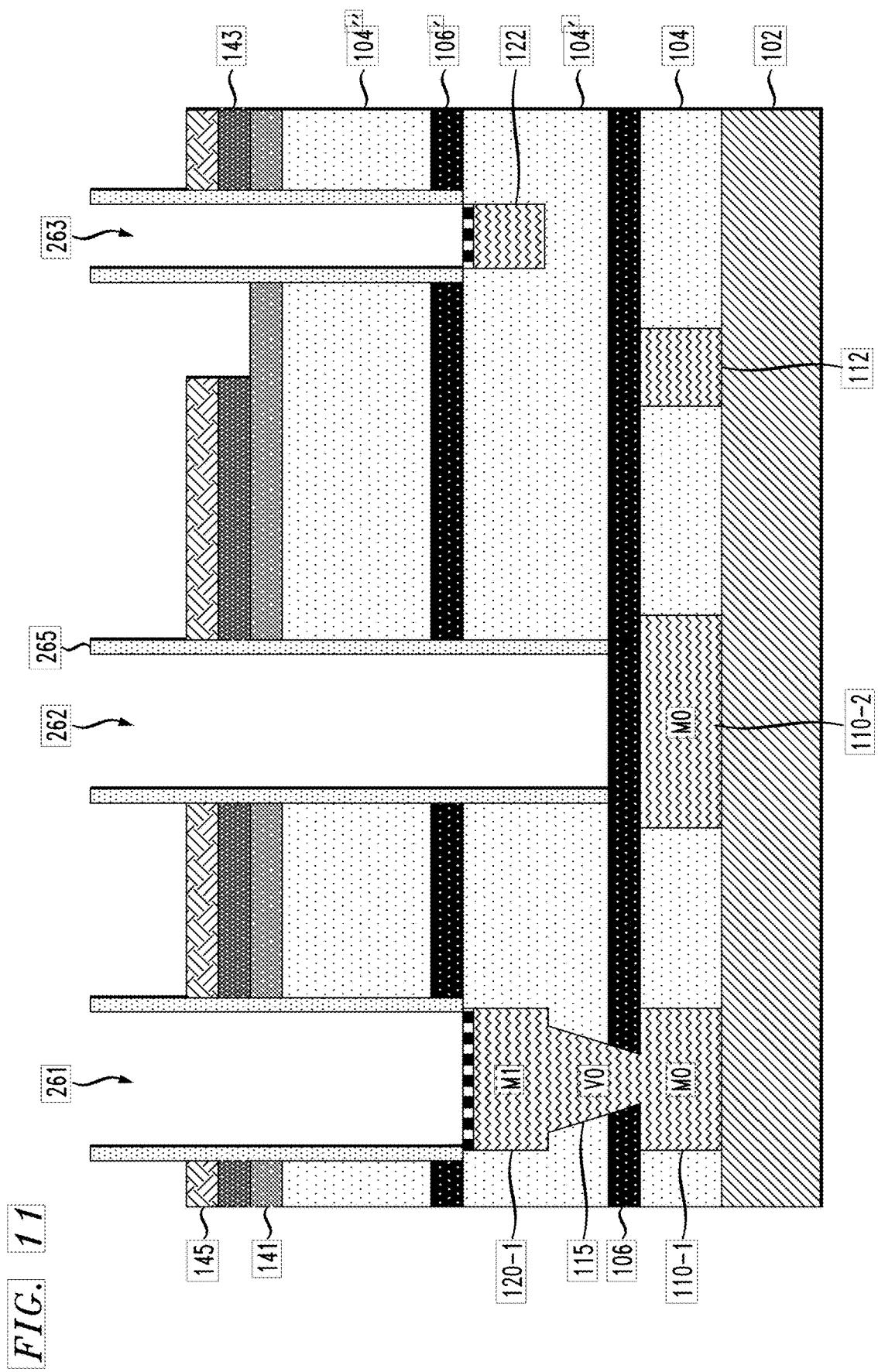
FIG. 11 is a cross-sectional view illustrating fabrication of a semiconductor device at a BEOL or MOL, and showing OPL removal, according to an exemplary embodiment of the present invention.

FIG. 11 is a cross-sectional view illustrating fabrication of a semiconductor device at a BEOL or MOL, and showing OPL removal, according to an exemplary embodiment of the present invention. Referring to FIG. 11, the OPL 150 is selectively removed using for example, oxygen plasma, nitrogen plasma, hydrogen plasma or other carbon strip or ashing process, which causes minimal or no damage to the remaining or underlying layers. The removal of the OPL 150 exposes the second layer 145 and a portion of the sacrificial layer 141 which corresponds to a stepped portion S' described in connection with FIG. 12. The stepped portion S' corresponds to a wider rightmost opening 146 between the layers 143 and 145 (see FIG. 2) than the rightmost opening 156 in the photoresist pattern 154 in FIG. 3.

Figure 12:
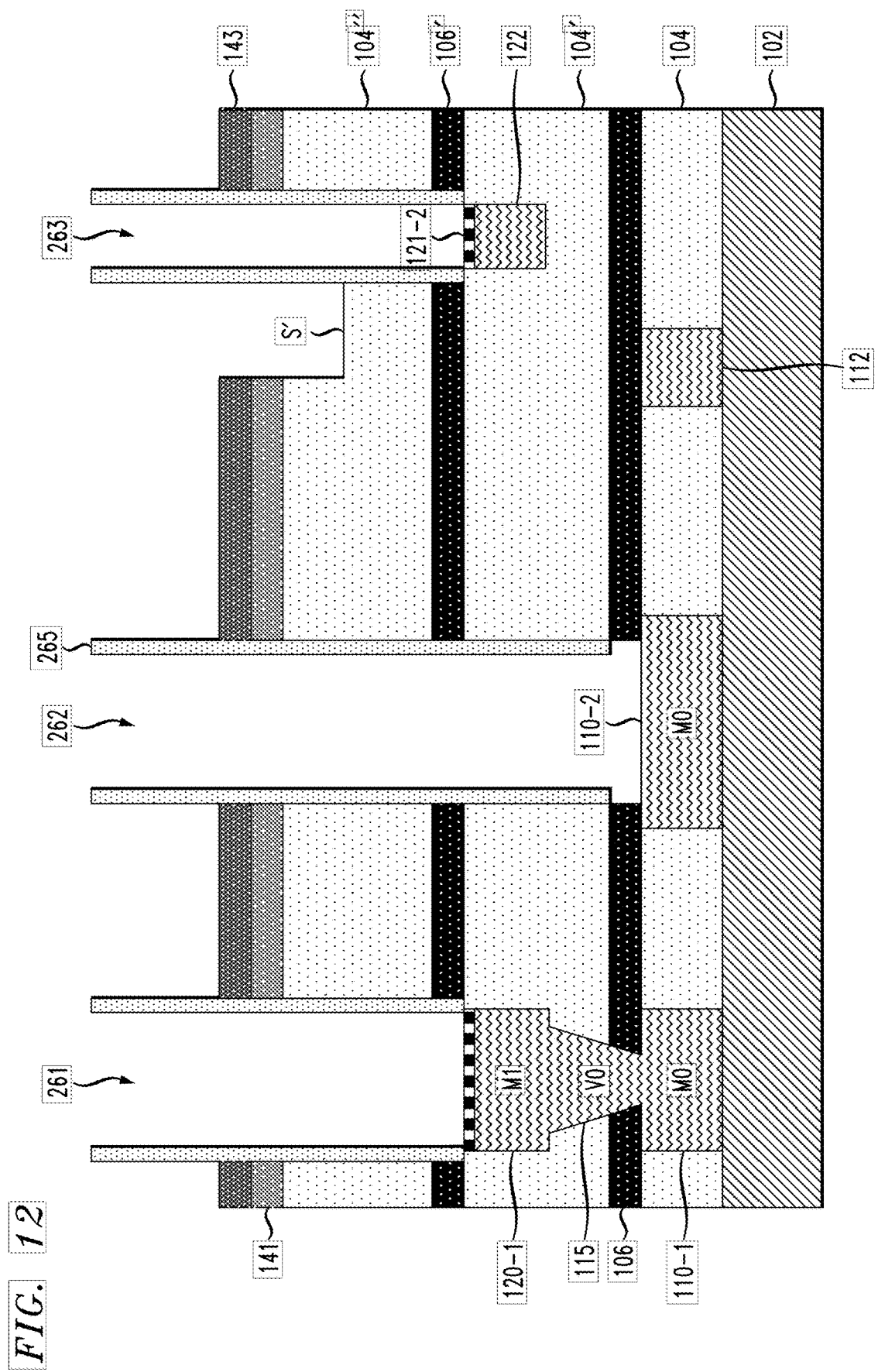
FIG. 12 is a cross-sectional view illustrating fabrication of a semiconductor device at a BEOL or MOL, and showing removal of an upper hardmask layer and trench etching, according to an exemplary embodiment of the present invention.

FIG. 12 is a cross-sectional view illustrating fabrication of a semiconductor device at a BEOL or MOL, and showing removal of an upper hardmask layer and trench etching, according to an exemplary embodiment of the present invention. Referring to FIG. 12, the second layer 145 of the hardmask structure is removed. As noted above, according to one or more embodiments of the present invention, the second layer 145 includes TEOS. The TEOS layer is removed using, for example, an oxide etching chemistry containing, for example, $C_xF_y$, which would include gases such as $CF_4$, $C_4F_8$, $C_4F_6$, $CH_2F_2$, etc., as well as dilution gases such as Ar, $N_2$, $H_2$, etc.

During removal of the second layer 145, a trench etch process is performed to remove the exposed portion of the layer 141, form the stepped portion S', and remove the dielectric cap layer 106 in the super via opening 262 in order to expose the conductive layer 110-2 in the first interconnect level 10. The trench etch process is performed using, for example, the oxide etching chemistry used for the removal of the second layer 145. The remaining spacers 265 in the openings 261, 262 and 263 protect the underlying dielectric layers 104" and 104' in the openings from exposure to the etchant during the trench etching process, so that the CDs (e.g., horizontal widths in FIG. 11) of the openings 261, 262 and 263 are maintained. Accordingly, due to the presence of the spacers, the CDs and straight profiles of the via and super via openings are controlled and maintained during the trench etch process. As a result, with reference to FIG. 15 described herein below, the resulting vias and super via have straight profiles with a constant lateral width from top to bottom of the vias and super via.

The exposed portion of the sacrificial layer 141 and a portion of the dielectric layer 104" under the exposed portion of the sacrificial layer 141 are etched to form the stepped portion S' during the trench etch process.

Figure 13:
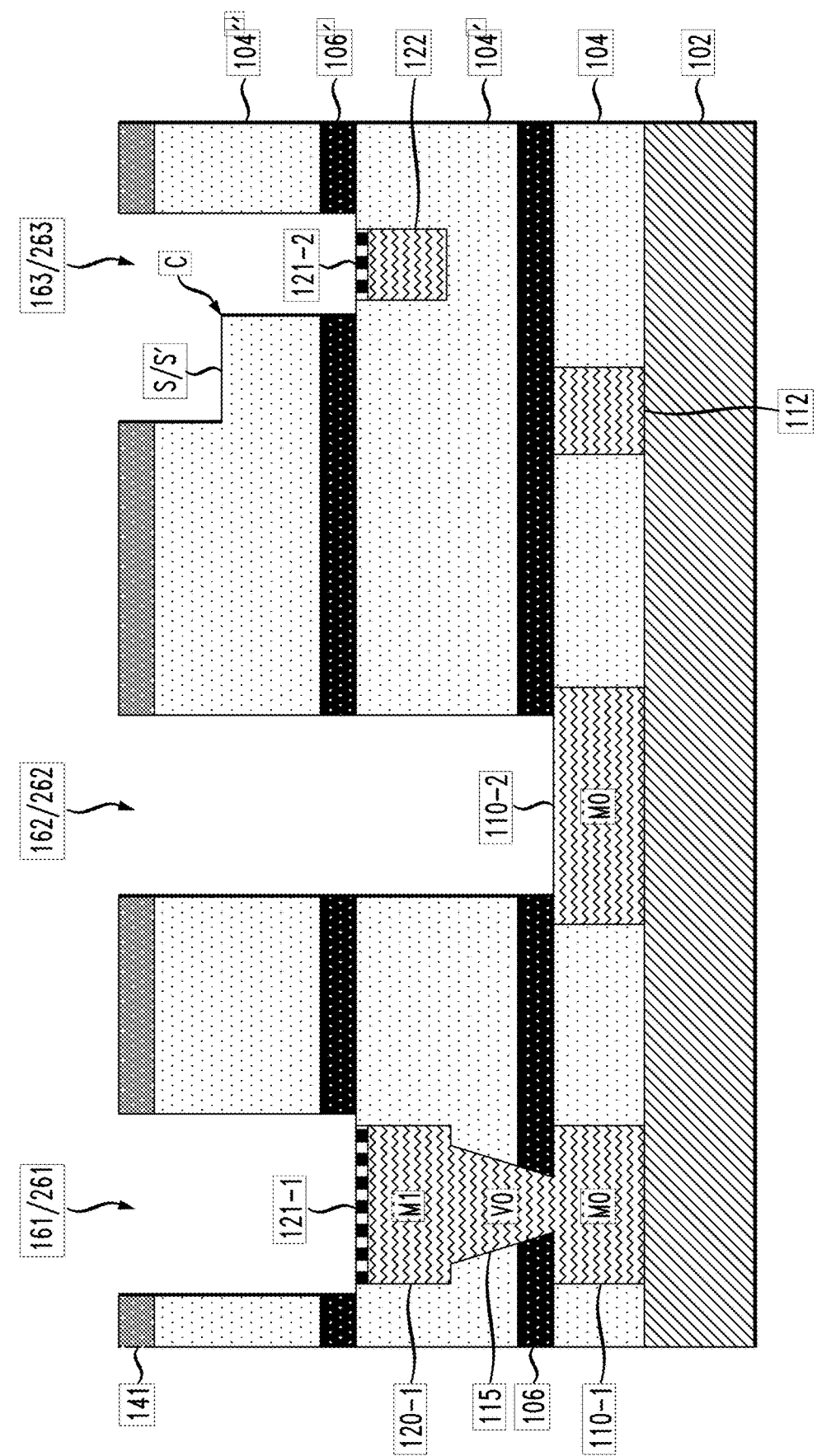
FIG. 13 is a cross-sectional view illustrating fabrication of a semiconductor device at a BEOL or MOL, and showing removal of hardmask and spacer layers, according to an exemplary embodiment of the present invention.
Figure 14:
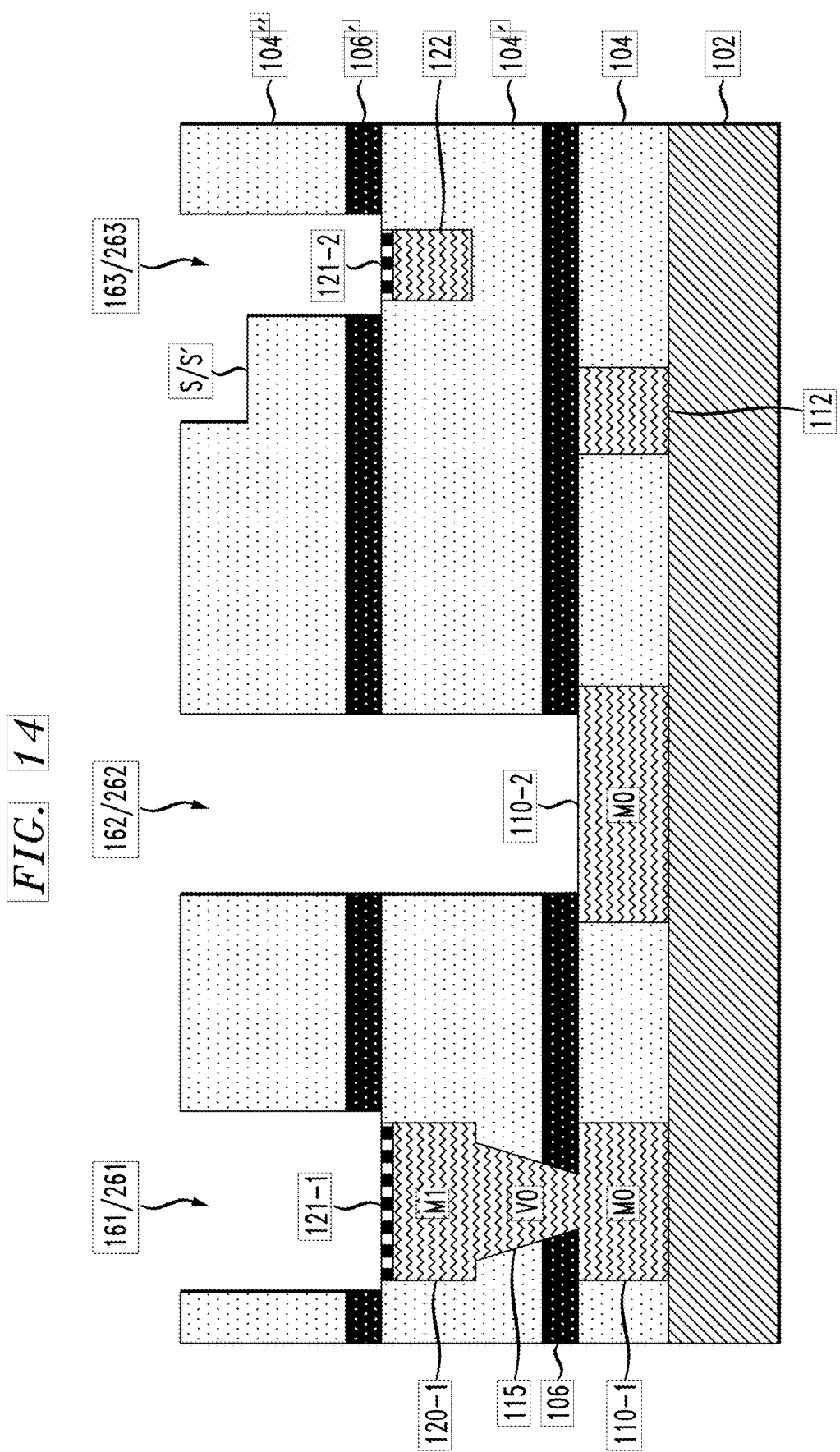
FIG. 14 is a cross-sectional view illustrating fabrication of a semiconductor device at a BEOL or MOL, and showing removal of a sacrificial layer, according to an exemplary embodiment of the present invention.
Figure 15:
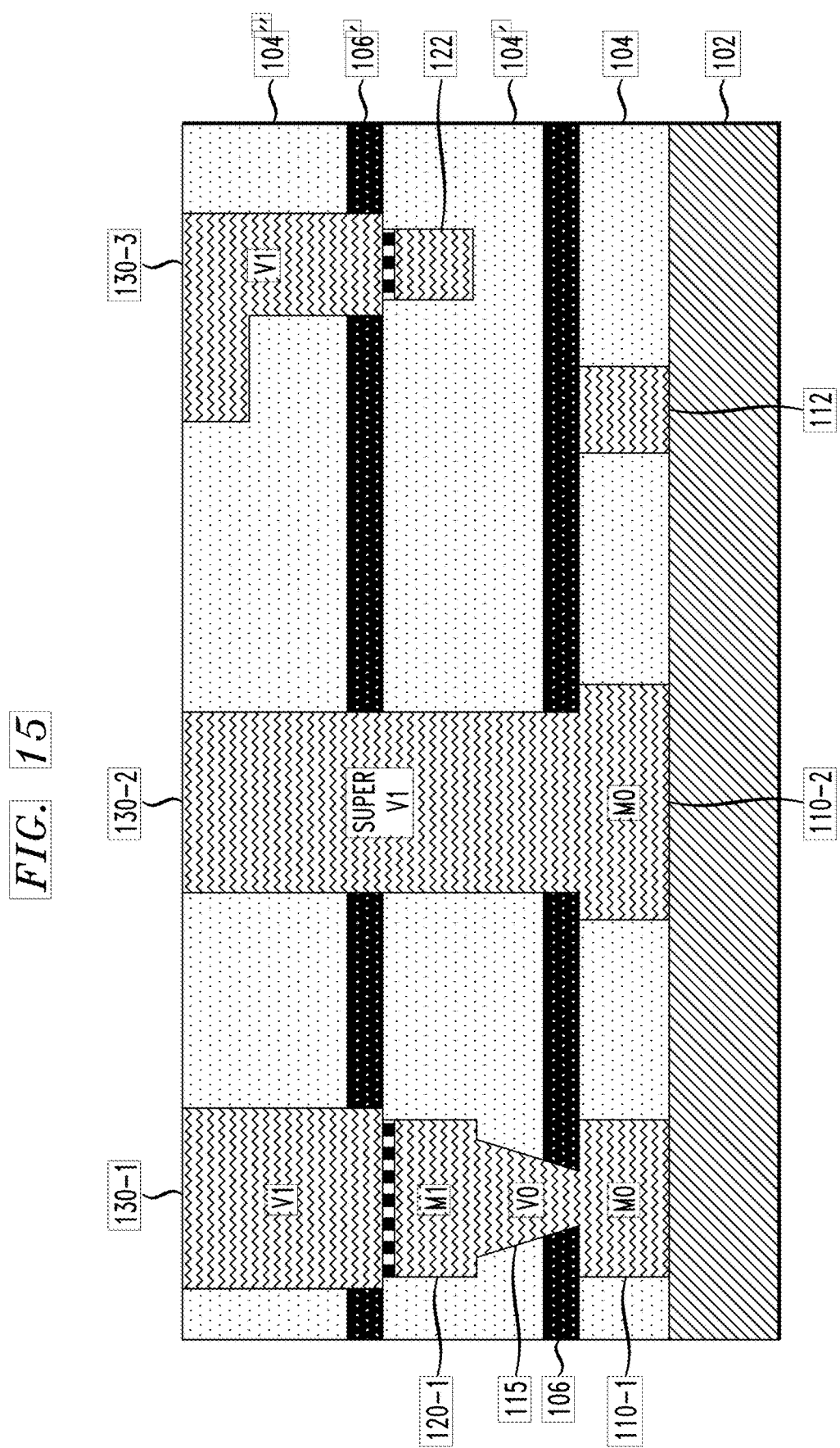
FIG. 15 is a cross-sectional view illustrating fabrication of a semiconductor device at a BEOL or MOL, and showing metallization and planarization, according to an exemplary embodiment of the present invention.

The processing described in FIGS. 13-15 follows from either FIG. 7 or FIG. 12. FIG. 13 is a cross-sectional view illustrating fabrication of a semiconductor device at a BEOL or MOL, and showing removal of hardmask and spacer layers, according to an exemplary embodiment of the present invention. Referring to FIG. 13, the remaining portions of the layer 143, which includes, for example, TiN and the spacer layers 165/265, which include, for example, TiN, AlN or $Al_2O_3$, are removed using, for example, a wet or dry etch chemistry suitable for removal of the layers 143 and 165/265. Referring to FIGS. 7 and 12, the presence of a spacer layer 165/265 on a vertical wall of the opening 163/263 adjacent the stepped portion S/S' and the cap layer 121-2 during trench etching protects the vertical wall from the etchant so that a sharp angle (e.g., 90° or about 90°) can be formed at the corner C between the stepped portion S/S' and the vertical wall. Maintaining the sharp angle prevents plasma-induced damage to the via sidewall by providing protection before OPL removal (e.g., ashing), thereby improving the bulk capacitance of the resulting device.

FIG. 14 is a cross-sectional view illustrating fabrication of a semiconductor device at a BEOL or MOL, and showing removal of a sacrificial layer, according to an exemplary embodiment of the present invention. Referring to FIG. 14, the sacrificial layer 141, which includes, for example, a multi-layer dielectric including a ULK dielectric, SiN and/or other dielectric material, is removed from on top of the dielectric layer 104" using, for example, dilute hydrofluoric acid (dHF). Alternatively, in one or more embodiments, the sacrificial layer 141 can be omitted.

FIG. 15 is a cross-sectional view illustrating fabrication of a semiconductor device at a BEOL or MOL, and showing metallization and planarization, according to an exemplary embodiment of the present invention. Referring to FIG. 15, electrically conductive layers 130-1, 130-2 and 130-3 including, for example, copper (Cu), nickel (Ni), cobalt (Co), iron (Fe), gold (Au), silver (Ag), ruthenium (Ru), palladium (Pd), platinum (Pt), iridium (Ir), tungsten (W), and any mixtures or alloys thereof are deposited in the openings 161/261, 162/262 and 163/263 using deposition techniques, including, but not necessarily limited to, electroplating, electroless plating, CVD and PVD techniques. The electrically conductive layers 130-1 and 130-3 form vias (V1) through one interconnect level (i.e., third interconnect level 30) to respectively contact conductive layer 120-1 and alignment marker 122 through the cap layers 121-1 and 121-2 in the second interconnect level 20. The electrically conductive layer 130-2 forms a super via (super V1) through two interconnect levels (i.e., interconnect level 30 and interconnect level 20) to contact the conductive layer 120-1 110-2 in the first interconnect level 10. Excess portions of the electrically conductive layers 130-1, 130-2 and 130-3 formed on the top surface of the dielectric layer 104" are polished off, using for example, a CMP process to planarize the top surface and result in structure shown in FIG. 15.

As can be seen in FIG. 15, each of the vias V1 and super V1 have straight profiles, and the super via (super V1) maintains CD control and a straight profile through multiple interconnect levels without a necking profile. Although a super via is illustrated as being formed through 2 interconnect levels, the embodiments of the present invention are not necessarily limited thereto, and may apply to super vias formed through more than 2 interconnect levels. It is to be understood that the rightmost via V1 in FIG. 15 is intentionally formed with the stepped portion S/S'. Excluding the area corresponding to the stepped portion S/S' (i.e., the area to the left of the corner C), the rightmost via V1 in FIG. 15 also has a straight profile due to the presence of the protective spacers 165/265 during etching.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:
1. A method for manufacturing a semiconductor device, comprising:
forming a first interconnect level comprising a first dielectric layer and a first conductive layer formed in the first dielectric layer;
forming a first cap layer on the first interconnect level;
forming a second interconnect level on the first cap layer, wherein the second interconnect level comprises a second dielectric layer and a second conductive layer formed in the second dielectric layer;
forming a third interconnect level on the second interconnect level, wherein the third interconnect level comprises a third dielectric layer;
removing portions of the second and third dielectric layers over the first conductive layer during an etching process to create a super via opening through the second and third interconnect levels and over the first conductive layer;
lining sides of the super via opening with a spacer material;
removing a portion of the first cap layer at a bottom of the super via opening from a top surface of the first conductive layer;
removing the spacer material from the super via opening; and
depositing a conductive material layer in the super via opening on the first conductive layer.

2. The method according to claim 1, further comprising:
forming a second cap layer on the second interconnect level, wherein the second cap layer is formed between the second and third interconnect levels; and
removing a portion of the second cap layer to create an opening in the second cap layer exposing the second dielectric layer, wherein the opening is formed over the first conductive layer.

3. The method according claim 2, wherein the third dielectric layer is formed on the second cap layer and in the opening in the second cap layer.

4. The method according to claim 1, further comprising:
forming a second cap layer on the second interconnect level, wherein the second cap layer is formed between the second and third interconnect levels; and
removing a portion of the third dielectric layer over the second conductive layer during the etching process to create a via opening through the third interconnect level and over the second conductive layer.

5. The method according to claim 4, further comprising:
lining sides of the via opening with the spacer material; and
removing a portion of the second cap layer at a bottom of the via opening from a top surface of the second conductive layer.

6. The method according to claim 5, further comprising:
removing the spacer material from the via opening; and
depositing another conductive material layer in the via opening on the second conductive layer.

7. The method according to claim 1, wherein the spacer material is deposited using atomic layer deposition (ALD).

8. The method according to claim 1, further comprising forming a hardmask structure on the third interconnect level, wherein the hardmask structure comprises a plurality of openings.

9. The method according to claim 8, wherein forming the hardmask structure comprises:
forming a first layer comprising titanium nitride (TiN) on the first layer; and
forming a second layer comprising tetraethyl orthosilicate (TEOS) on the first layer.

10. The method according to claim 8, further comprising depositing an organic planarization layer (OPL) on the hardmask structure and in the plurality of openings.

11. The method according to claim 10, further comprising forming a photoresist pattern on the OPL, wherein the photoresist pattern comprises a plurality of openings corresponding to the plurality of openings in the hardmask structure.

12. The method according to claim 11, wherein an opening of the plurality of openings in the photoresist pattern and an opening of the plurality of openings in the hardmask structure are formed over the first conductive layer.

13. The method according to claim 11, further comprising forming an underlayer between the OPL and the photoresist pattern.

14. A method for manufacturing a semiconductor device, comprising:
forming a first interconnect level comprising a first dielectric layer and a conductive metal layer formed in the first dielectric layer;
forming a cap layer on the first interconnect level;
forming a second interconnect level on the cap layer, wherein the second interconnect level comprises a second dielectric layer;
forming a third interconnect level on the second interconnect level, wherein the third interconnect level comprises a third dielectric layer;
forming an opening through the second and third interconnect levels and over the conductive metal layer;
lining sides of the opening with a spacer material;
removing a portion of the cap layer at a bottom of the opening from a top surface of the conductive metal layer;
removing the spacer material from the opening; and
depositing a conductive material layer in the opening on the conductive metal layer.

15. The method according to claim 14, wherein the opening has a straight profile through the second and third interconnect levels.

* * * * *